(12) United States Patent
Amano

(10) Patent No.: US 6,353,316 B1
(45) Date of Patent: Mar. 5, 2002

(54) MAGNETO-RESISTIVE ELEMENT AND THIN FILM MAGNETIC HEAD COMPRISING THE SAME

(75) Inventor: Hajime Amano, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/334,932

(22) Filed: Jun. 17, 1999

(30) Foreign Application Priority Data

Jun. 18, 1998 (JP) ............................................ 10-170814

(51) Int. Cl.⁷ .............................. G11B 5/39; G01R 33/09
(52) U.S. Cl. ...................... 324/252; 338/32 R; 360/313; 360/317; 360/327.3
(58) Field of Search .............................. 360/113, 327.3, 360/313, 317; 324/252; 338/32 R

(56) References Cited

U.S. PATENT DOCUMENTS

| | | | | |
|---|---|---|---|---|
| 3,840,898 A | * | 10/1974 | Bajorek et al. | 360/113 |
| 4,024,489 A | | 5/1977 | Bajorek et al. | 338/32 R |
| 5,872,690 A | * | 2/1999 | Tadokoro et al. | 360/113 |
| 5,959,813 A | * | 9/1999 | Watanabe et al. | 360/126 |

FOREIGN PATENT DOCUMENTS

JP  A-3-125311  5/1991

* cited by examiner

Primary Examiner—Hezron Williams
Assistant Examiner—Henry S. Andersen
(74) Attorney, Agent, or Firm—Oliff & Berridge, PLC

(57) ABSTRACT

A magnetoresistive film through which a sense current for detecting a resistance change due to a magnetic field to be detected flows in a longitudinal direction, and a lateral bias film which is magnetized in a fixed direction by a constant magnitude such that a lateral bias is applied to said magnetoresistive film in a lateral direction intersecting said longitudinal direction are arranged to be opposed to each other via a magnetic isolation film. By conducting said sense current by means of a pair of lead conductive films coupled electrically to both edges of said magnetoresistive film, a magnetization recorded on a magnetic record medium can be detected. Since the lateral bias is applied to the magnetoresistive film such that the lateral bias is not affected by the sense current and external magnetic fields, the magnetization of the magnetic record medium can be stably detected without being influenced by the sense current and external magnetic fields. Said lateral bias film is preferably provided to extend beyond both edges of the magnetoresistive film viewed in the longitudinal direction.

23 Claims, 7 Drawing Sheets

MAGNETO-RESISTIVE ELEMENT AND THIN FILM MAGNETIC HEAD COMPRISING THE SAME

BACKGROUND OF THE INVENTION

1. Field of the Invention

The present invention relates to a magnetoresistive element utilizing the magnetoresistive effect (hereinafter also called MR element), and also relates to a thin film magnetic head comprising the MR element.

2. Explanation of the Related Art

In accordance with the miniaturization of a magnetic disc drive, a thin film magnetic head including a MR element as a reading element has been known as a magnetic converting device which is suitable for reading information recorded on a magnetic record medium with a high density, because an output from the MR element is not related to a relative velocity of the MR element and the magnetic disc. Furthermore, there has been widely used a combination type thin film magnetic head having a magnetoresistive type thin film magnetic head for reading and an inductive type thin film magnetic head for writing, which are stacked one on the other on a substrate.

A MR element used as the reading magnetoresistive element is disclosed in, for instance Japanese Patent Application Laid-open Publication Kokai Hei 3-125311. The magnetoresistive element described in this publication includes a central active region and passive end portions arranged on either sides thereof. The central active region comprises a magnetoresistive film (hereinafter referred to as a MR film), a magnetic isolation film (non-magnetic spacer film) and a soft magnetic film. The soft magnetic film has a function to apply a lateral magnetic bias (lateral bias) to the MR film.

Each of a pair of the passive end portions comprises longitudinal bias films applying a longitudinal magnetic bias to the MR film, and lead conductive films. The longitudinal bias films serve to apply the longitudinal magnetic bias to the MR film, and are arranged on opposite sides of the central active region. The lead conductive films are provided on these longitudinal bias films.

When a sense current is flowed through the MR film to generate a magnetic flux, the soft magnetic film is magnetized in an axis of easy magnetization by the thus generated magnetic flux, and a magnetic field is generated by this magnetization. The MR film is magnetized laterally by the thus generated magnetic field. A direction in which the MR film is magnetized is rotated from the longitudinal direction to the lateral direction by a certain angle in accordance with the lateral bias. In this manner, a linear operation can be performed upon reading data recorded on the magnetic disc and so on.

The longitudinal bias films serve to apply a longitudinal magnetic bias (longitudinal bias) to the MR film to suppress Barkhausen noise. U.S. Pat. No. 4,024,489 discloses a MR sensor using a hard magnetic bias film as the longitudinal bias film.

When a magnetic field produced by data magnetically recorded on a magnetic record medium is applied to the MR film such that this magnetic field intersects the direction of the magnetization of the MR film, the direction of the magnetization of the MR film is changed. This results in that a resistance of the MR film is changed, and the sense current flowing through the MR film is changed accordingly. When the direction of the magnetic field produced by data magnetically recorded on the magnetic record medium is coincided with the direction of the magnetization of the MR film, the direction of the magnetization is not changed, and therefore the resistance of the MR film is not substantially changed.

In this specification, the longitudinal direction is a direction in which the sense current flows in the MR film and the lateral direction means a direction which crosses the longitudinal direction. It should be noted that the longitudinal direction is not always perpendicular to the lateral direction.

As stated above, in the known thin film magnetic head, the soft magnetic film is magnetized in the direction of the axis of easy magnetization by the magnetic field induced by the sense current flowing through the MR film, and the lateral magnetic bias is applied to the MR film with the aid of the magnetic field induced by said magnetization in the soft magnetic film. Therefore, a direction and a magnitude of the lateral bias (referred to as a lateral bias amount) are liable to be different from respective thin film magnetic heads and an output signal is liable to be asymmetrical and fluctuate. This results in a decrease in a manufacturing yield of the thin film magnetic head. Causes by which the lateral bias amount fluctuate may be summarized as follows.

(a) The lateral bias amount is sensitive to thickness of the MR film, magnetic isolation film and soft magnetic layer, and therefore the lateral bias amount fluctuates in accordance with a variation in thickness of these films.

(b) The lateral bias amount is influenced by external magnetic fields under the using condition, and is liable to fluctuate.

(c) Since the MR element is constructed such that the soft magnetic layer is magnetized in the direction of the axis of easy magnetization by the magnetic field induced by the sense current and the lateral bias to the MR film is produced by the magnetic field induced by said magnetization in the soft magnetic layer, the lateral bias amount is liable to be affected by a magnetic anisotropic dispersion of the soft magnetic layer. Therefore, the lateral bias amount becomes non-uniform.

SUMMARY OF THE INVENTION

An object of the present invention is to provide a magnetoresistive element, in which a constant lateral bias can be applied without being affected by the sense current and external disturbing magnetic fields, and thus a very small change in magnetization can be detected stably.

Another object of the present invention is to provide a magnetoresistive element, in which a fluctuation in characteristics for respective elements can be reduced, and elements can be manufactured with a high yield.

Another object of the present invention is to provide a magnetoresistive element having small noise and high performance.

The present invention also relates to a thin film magnetic head including an MR element, and has for its object to provide a thin film magnetic head in which a surface recording density on a magnetic record medium can be increased by providing a magnetoresistive element which can detect stably a very small change in magnetization.

According to the present invention, a magnetoresistive element comprises:

a magnetoresistive film through which a sense current for detecting a change in resistance due to a magnetization to be detected flows in a longitudinal direction;

a pair of lead conductive films coupled with both end portions of the magnetoresistive film viewed in the longitudinal direction in an electrically conductive manner and conducting the sense current in the longitudinal direction;

a lateral bias film magnetized in a fixed direction by a constant magnitude to apply a lateral bias in a lateral direction which crosses said longitudinal direction, said lateral bias being not influenced by said sense current and external magnetic fields; and a substrate supporting said magnetoresistive film, lead conductive layers and lateral bias film.

In the magnetoresistive element according to the present invention, the lateral bias film serves to apply the lateral bias to the magnetoresistive film. Therefore, when the direction of the magnetization of the MR film due to a magnetic field induced by data recorded on a magnetic record medium is changed, a resistance of the magnetoresistive film is varied. Thus, by conducting the constant sense current through the magnetoresistive film, the variation in the resistance can be detected as a variation in a voltage across the magnetoresistive film, and the recorded data can be read out.

In the magnetoresistive element according to the invention, said lateral bias film is magnetized such that the constant lateral bias which is not affected by the sense current flowing through the MR film and external magnetic fields can be applied to the magnetoresistive film in the fixed lateral direction. That is to say, a direction and a magnitude of the lateral bias applied to the magnetoresistive film can be stably set to the fixed direction and constant magnitude in accordance with the magnetization of the lateral bias film itself. Therefore, the direction and magnitude of the lateral bias are not changed by the sense current and external magnetic fields, and thus the external field produced by the data recorded on the magnetic record medium can be stably read out.

In one embodiment of the magnetoresistive element according to the invention, said lateral bias film includes a antiferromagnetic film and a magnetic film which is exchangecoupled with said antiferromagnetic film. In another embodiment of the magnetoresistive element according to the invention, said lateral bias film includes a hard magnetic film (magnet).

Like as the conventional magnetoresistive element, in the magnetoresistive element according to the invention, said magnetic isolation film may be arranged between said magnetoresistive film and said lateral bias film.

In the magnetoresistive element according to the invention, plane configuration of said lateral bias film and magnetoresistive film viewed in the longitudinal direction may be identical with each other or both end portions of the lateral bias film may be protruded from both edges of the magnetoresistive film. In the latter case, it is possible to obtain a magnetoresistive element, in which the lateral bias amount is not influenced by the magnetic anisotropic dispersion due to instability of the antiferromagnetic coupling which is remarkably appearing at end portions of a lateral bias mask mark depending upon the shape of the lateral bias film.

In another embodiment of the magnetoresistive element according to the invention, a pair of longitudinal bias films applying a longitudinal bias to the magnetoresistive film are arranged at both end portions of the magnetoresistive film viewed from the longitudinal direction. This longitudinal bias film may be formed by a hard magnetic film or a combination of an antiferromagnetic film and a magnetic film which generates an exchange-coupling with the antiferromagnetic film.

According to the invention, a thin film magnetic head comprises the above explained reading magnetoresistive element, an inductive type writing thin film magnetic head, and a substrate supporting said magnetoresistive element and inductive type thin film magnetic head in a stacked fashion.

EXPLANATION OF THE PREFERRED EMBODIMENTS

The magnetoresistive element according to the present invention may be typically applied to a reading element in a thin film magnetic head, and therefore the magnetoresistive element applied to the thin film magnetic head will be explained. However, the magnetoresistive element according to the invention may be utilized in another applications.

Figure 1:
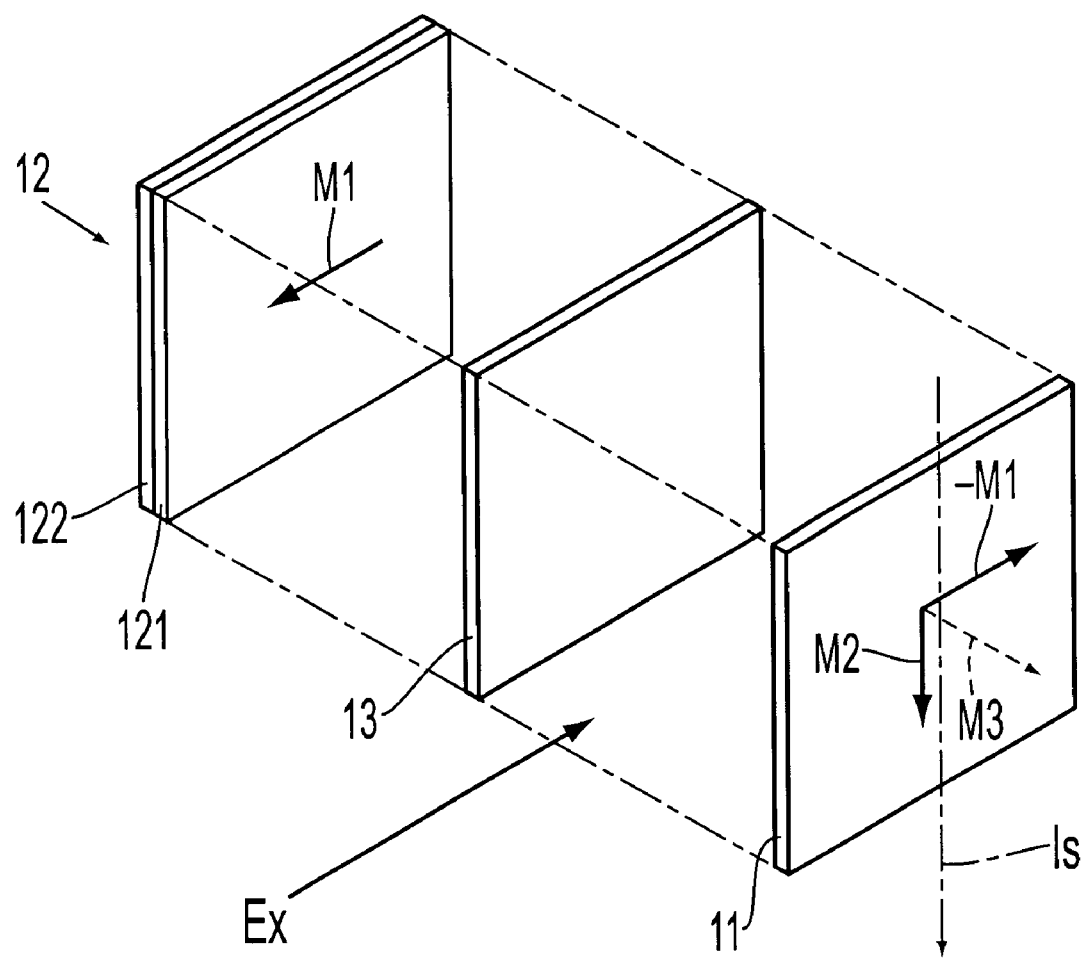
FIG. 1 is an exploded perspective view showing a first principal structure of the MR element according to the invention.

FIG. 1 is an exploded perspective view showing a first principal structure of the magnetoresistive element according to the invention. As shown in the drawing, the MR element comprises a magnetoresistive (MR) film 11, and a lateral bias film 12 separated from the MR film by a magnetic isolation film 13 provided on the lateral bias film. The MR film 11 is formed by a film made of a material which reveals the magnetoresistive effect due to the magnetic anisotropy. A sense current Is flows through the MR film 11 in order to detect a variation of resistance. In the present specification, the direction in which the sense current flows is denoted as a longitudinal direction.

According to the invention, the lateral bias film 12 has a magnetization M1 whose direction is fixed and whose magnitude is constant. Such a lateral bias film 12 having the magnetization M1 can apply a lateral bias (–M1) having a fixed direction and a constant magnitude to the MR film 11 in regardless of the sense current flowing through the MR film 11. This lateral bias (–M1) is not affected by external magnetic fields which would be produced under a normal operating condition.

When the lateral bias (−M1) is not applied, the MR film 11 is magnetized in the longitudinal direction (M2). When the lateral bias (−M1) is applied, a magnetization (M3) of the MR film 11 is rotated from the longitudinal magnetization (M2) by a certain angle due to a vector composition between the longitudinal magnetization (M2) and the lateral bias (−M1). In FIG. 1, the magnetization M1, M2 and M3 are denoted as vectors, but their directions and magnitudes do not indicate with actual directions and magnitudes, but are illustrated for the sake of explanation. The MR film 11 may be made of, for instance permalloy. Composition, thickness, manufacturing method of the MR film are well known to a person skilled in the art, and thus are not explained here.

The magnetic isolation film 13 is arranged between the MR film 11 and the lateral bias film 12. The magnetic isolation film 13 may be formed by a Ta film having a thickness of, for instance 2–20 nm. The magnetic isolation film 13 may be made of a non-magnetic insulating material such as $Al_2O_3$, AlN, $SiO_2$, SiN, BN and AlON.

As stated above, the lateral bias (−M1) is applied to the MR film 11 by means of the lateral bias film 12 having the magnetization M1 whose direction intersects the longitudinal direction in which the sense current flows and whose magnitude M1 is fixed. Therefore, when the direction of the magnetization M3 of the MR film 11 is changed by a magnetic field Ex produced by data recorded on a magnetic record medium, the resistance of the MR film 11 is changed accordingly. Then, a voltage produced across both ends of the MR film 11 due to the sense current Is flowing through the MR film 11, and the magnetic record data can be read out as a change in the output voltage.

As explained above, in the present invention, the lateral bias film 12 has the magnetization M1 whose direction is fixed and whose magnitude is constant, and the lateral bias film 12 apply, to the MR film 11, the lateral magnetization (−M1) which is not affected by the sense current Is flowing through the MR film 11. Therefore, a magnitude of the lateral bias to the MR film 11 can be set to a constant stable value in accordance with the magnitude of the magnetization M1 of the lateral bias film itself. A magnitude of the lateral bias (−M1) is neither varied by the sense current Is nor changed by the external magnetic fields.

The above mentioned lateral bias film 12 may be realized by the structure including an antiferromagnetic film 122 and a magnetic film 121 which produces the exchange-coupling with the antiferromagnetic film 122. In this film structure, the direction of the magnetization of the magnetic film 121 can be fixed by the antiferromagnetic coupling. The magnetic film 121 may be made of Co or compounds containing Co and at least one metal, or NiFe or alloys containing NiFe and at least one metal, or Fe or compounds containing Fe, at least one metal and at least one of elements N, C and B, if any. The magnetic film 121 is formed to have a thickness of about 2–30 nm.

The antiferromagnetic film 122 may be made of alloys containing Mn and at least one metal, and may be made of, for instance PtMn or NiMn. The antiferromagnetic film 122 may be also made of metal oxides revealing the antiferromagnetism such as NiO and CoO. The antiferromagnetic film 122 may be further made of $\alpha\text{-}Fe_2O_3$ or compounds containing $\alpha\text{-}Fe_2O_3$. The antiferromagnetic film 122 is formed to have a thickness of about 5–40 nm.

Alternately, the lateral bias film 12 may include a hard magnetic film (magnet). The hard magnetic film may be made of Co, Fe, Ni or alloys containing at least one of these metals. For instance, CoPtCr, CoPt and CoFe may be used.

Figure 2:
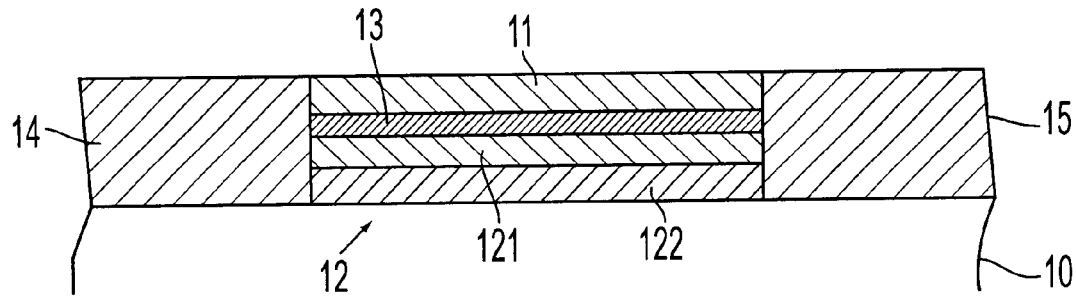
FIG. 2 is a cross sectional view illustrating a first embodiment of the MR element according to the invention.

FIG. 2 is a cross sectional view illustrating a first embodiment of the MR element having the first principal structure according to the invention shown in FIG. 1. In this drawing, portions similar to those shown to FIG. 1 are denoted by the same reference numerals used in FIG. 1. As shown in FIG. 2, the lateral bias film 12 (including antiferromagnetic film 122 and magnetic film 121) is deposited upon substrate 10, magnetic isolation film 13 is deposited upon lateral bias film 12, and MR film 11 is deposited upon magnetic isolation film 13. A pair of lead conductive films 14 and 15 are connected to respective ends of the MR film 11. The sense current Is passes through the magnetoresistive film 11 from left to right in the plane of FIG. 2. Each of the lead conductive films 14, 15 is formed by a stacked film of TiW/Ta.

Figure 3:
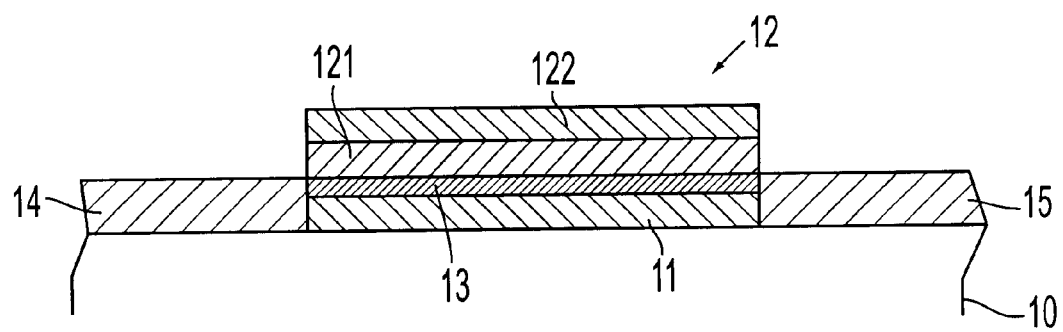
FIG. 3 is a cross sectional view illustrating a second embodiment of the MR element according to the invention.

FIG. 3 is a cross sectional view depicting a second embodiment of the MR element according to the invention. In this embodiment, a MR film 11 is formed as a bottom film, and a magnetic isolation film 13 and a lateral bias film 12 are successively deposited thereon. A magnetic film 121 of the lateral bias film 12 for fixing the magnetization is adjacent to the magnetic isolation film 13 and an antiferromagnetic film 122 is stacked on the magnetic film 121.

Figure 4:
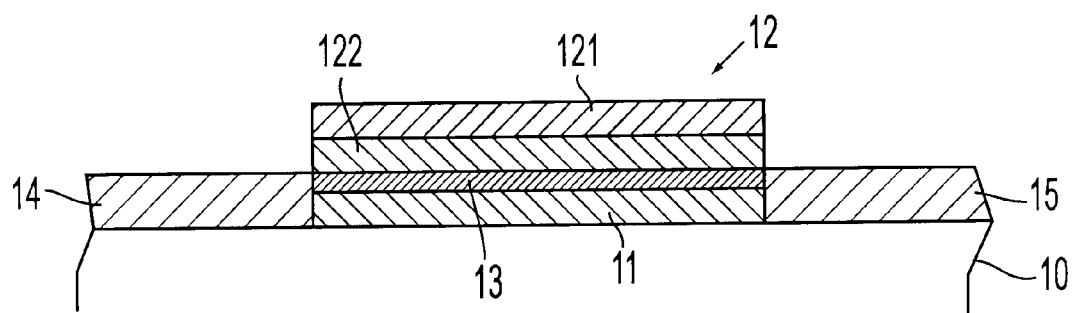
FIG. 4 is a cross sectional view illustrating a third embodiment of the MR element according to the invention.

FIG. 4 is a cross sectional view depicting a third embodiment of the MR element according to the invention. In this embodiment, an antiferromagnetic film 122 of a lateral bias film 12 is adjacent to a magnetic isolation film 13 and a magnetic film 121 for fixing the magnetization is stacked on the antiferromagnetic film 122.

Figure 5:
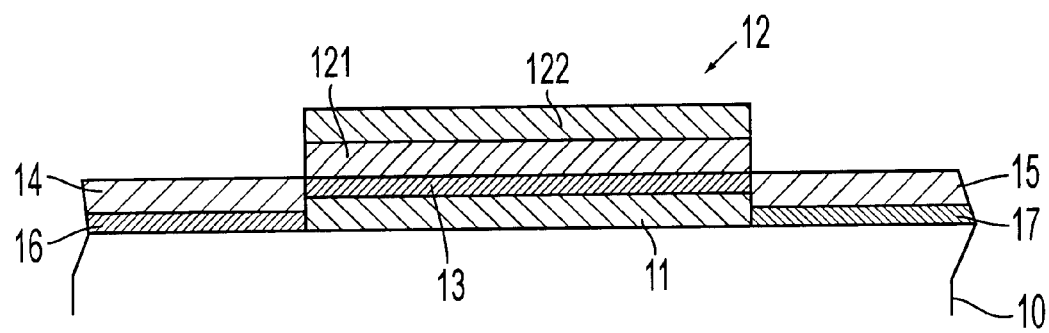
FIG. 5 is a cross sectional perspective view showing a fourth principal structure of the MR element according to the invention.

FIG. 5 is a cross sectional view showing a fourth embodiment of the MR element according to the invention. The MR element of this embodiment comprises longitudinal bias films 16 and 17. The longitudinal bias films 16 and 17 serve to apply a longitudinal bias to a MR film 11. The longitudinal bias films 16 and 17 may be formed by a hard magnetic film. In this case, a uniform longitudinal bias can be applied to the MR film 11 by means of a magnetic field induced by the magnetized hard magnetic film, and Barkhausen noise due to the movement of magnetic domains can be suppressed. The hard magnetic film may be made of CoPtCr and may have a thickness of about 20 nm.

The longitudinal films 16 and 17 may be also formed by an antiferromagnetic film. In this case, a uniform longitudinal bias is applied to the MR film 11 with the aid of the exchange coupling between the antiferromagnetic film and the MR film 11, and Barkhausen noise due to the movement of magnetic domains can be suppressed.

Figure 6:
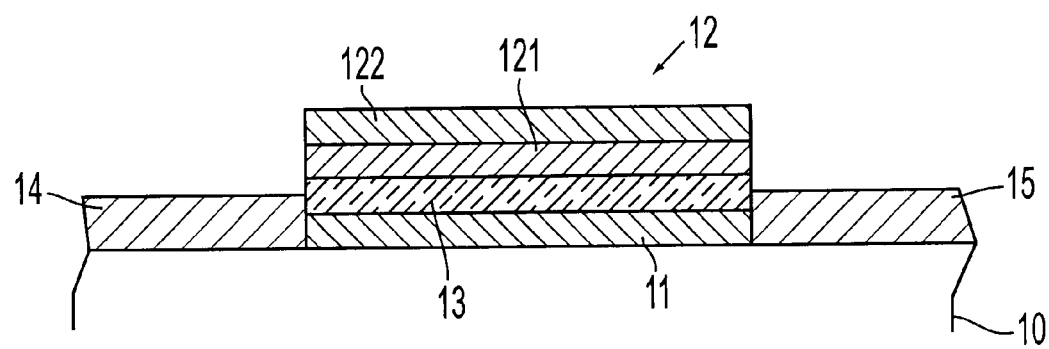
FIG. 6 is a cross sectional view illustrating a fifth embodiment of the MR element according to the invention.

FIG. 6 is a cross sectional view illustrating a fifth embodiment of the MR element according to the invention. In this embodiment, a magnetic isolation film 13 is made of a non-magnetic and electrically insulating material such as $Al_2O_3$, and a lateral bias film 12 is electrically isolated from lead conductive films 14, 15 and MR film 11. Therefore, the lateral bias film 12 is not affected by the sense current Is at all.

Figure 7:
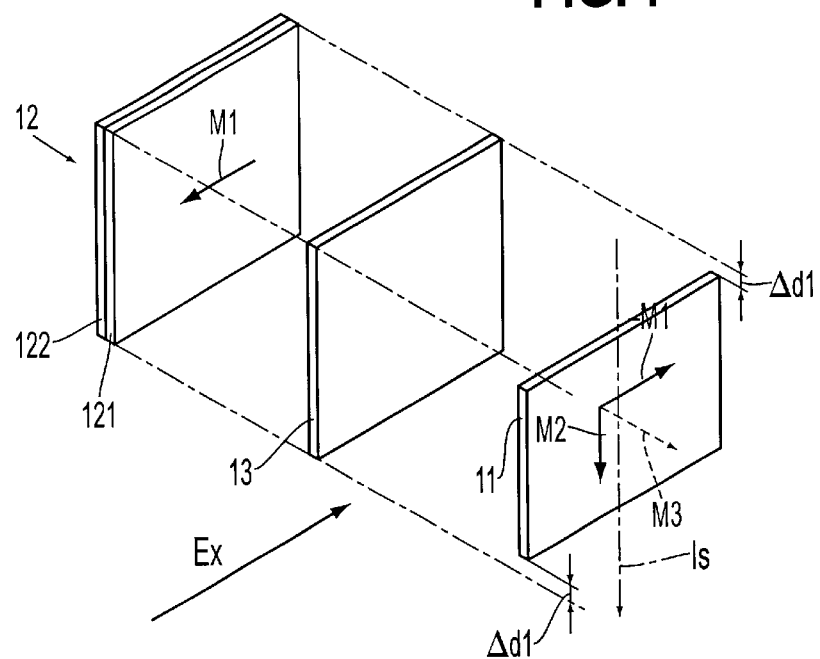
FIG. 7 is an exploded perspective view showing a second principal structure of the MR element according to the invention.

FIG. 7 is an exploded perspective view showing another principal structure of the MR element according to the invention. In the drawing, portions similar to those shown in FIG. 1 are denoted by the same reference numerals used in FIG. 1. A lateral bias film 12 has a plane configuration, in which both edges of the lateral bias film 12 viewed in the longitudinal direction protrude beyond corresponding edges of a MR film 11 by a distance Δd1. By adopting such a structure, it is possible to obtain a merit that the lateral bias amount applied to the MR film 11 is not affected by the magnetic amisotropic dispersion due to a configuration to the lateral bias film 12 and an instability of the exchange coupling between a magnetic film 121 and an antiferromagnetic film 122.

Figure 8:
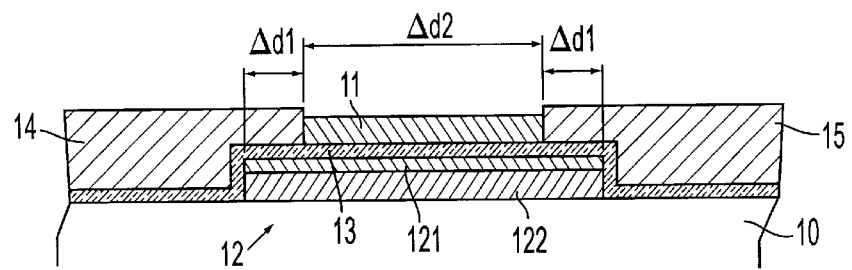
FIG. 8 is a cross sectional view illustrating a sixth embodiment of the MR element according to the invention.

The distance Δd1 is preferably set to not larger than 0.1 μm. A range over which the distance Δd1 can vary is determined by a length Δd2, as shown in FIG. 8, of the MR film 11 viewed in the longitudinal direction and defining a track width of the MR element 12. When the track width of the MR element 12 is not less than 0.1 μm, the distance Δd1 is preferably set to a value not less than 0.2 μm. When the track width of the MR element 12 is smaller than 1.0 μm, the distance Δd1 is preferably set to a value not less than 0.10 μm. It should be noted that there is not an upper limit for the distance Δd1, and may be determined in accordance with the manufacturing process. For instance, the lateral bias film may extend up to edges of the lower shield film viewed from the air bearing surface, said shield film serving to shield the MR element 12 from the external magnetic fields.

FIG. 8 is a cross sectional view showing a sixth embodiment of the MR element having the principal structure shown in FIG. 7. In the drawing, portions similar to those shown in FIG. 7 are denoted by the same reference numerals used in FIG. 7. A lateral bias film 12 is formed on one surface of a substrate 10, and a magnetic isolation film 13 is formed on the lateral bias film. A MR film 11 is formed on the magnetic isolation film 13. Furthermore, both ends of the lateral bias film 12 extend outwardly beyond corresponding ends of the MR film 11 by a distance Δd1. In this embodiment, the magnetic isolation film 13 is formed such that not only the lateral bias film 12 but also the surface of the substrate 10 are covered with the magnetic isolation film 13, and the MR film 11 and lead conductive films 14, 15 electrically connected thereto are formed on the magnetic isolation film. In a modification of the embodiment illustrated in FIG. 8, the MR film 11 and lead conductive films 14, 15 are formed on the substrate 10, and the lateral bias film 12 is formed thereon via the magnetic isolation film 13.

Figure 9:
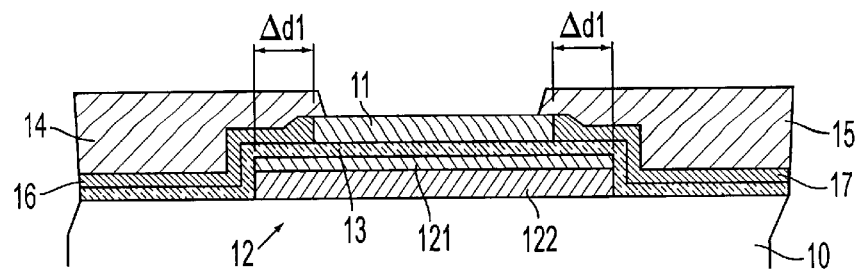
FIG. 9 is a cross sectional view illustrating a seventh embodiment of the MR element according to the invention.

FIG. 9 is a cross sectional view showing a seventh embodiment of the MR element having the principal structure shown in FIG. 7. The MR element of this embodiment comprises longitudinal bias films 16, 17. The function of the longitudinal bias films 16, 17 have been explained.

Figure 10:
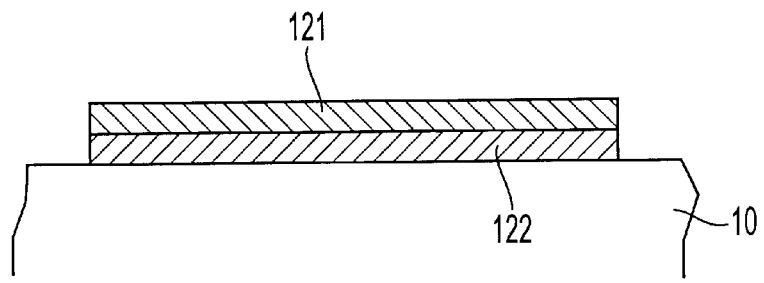
FIGS. 10–14 are cross sectional views depicting successive steps of manufacturing the MR element shown in FIG. 9.

Now the method of manufacturing the MR element shown in FIG. 9 will be explained with reference to FIGS. 10–14. At first, as depicted in FIG. 10, on a surface of the substrate 10 are successively formed the antiferromagnetic film 122 and magnetic film 121 by sputtering. Composition, material and thickness of the antiferromagnetic film 122 and magnetic film 121 have been stated above.

Figure 11:
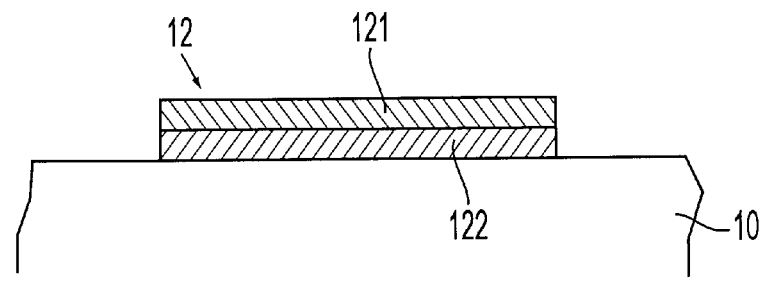

Next, as illustrated in FIG. 11, the antiferromagnetic film 122 and magnetic film 121 are patterned to have a desired longitudinal size to form the lateral bias film 12. The patterning may be carried out by the photolithography, milling or dry or wet etching.

Figure 12:
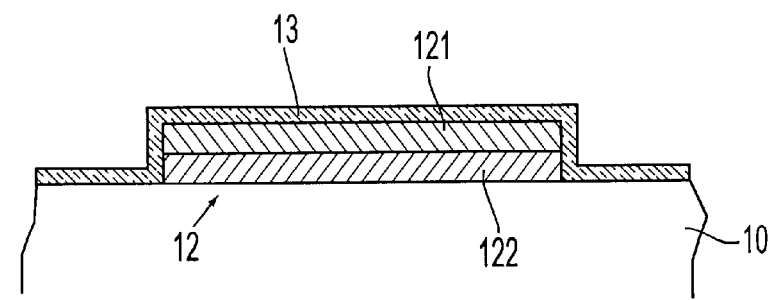

Then, as shown in FIG. 12, the magnetic isolation film 13 is deposited on the lateral bias film 12 and substrate 10 by the sputtering.

Figure 13:
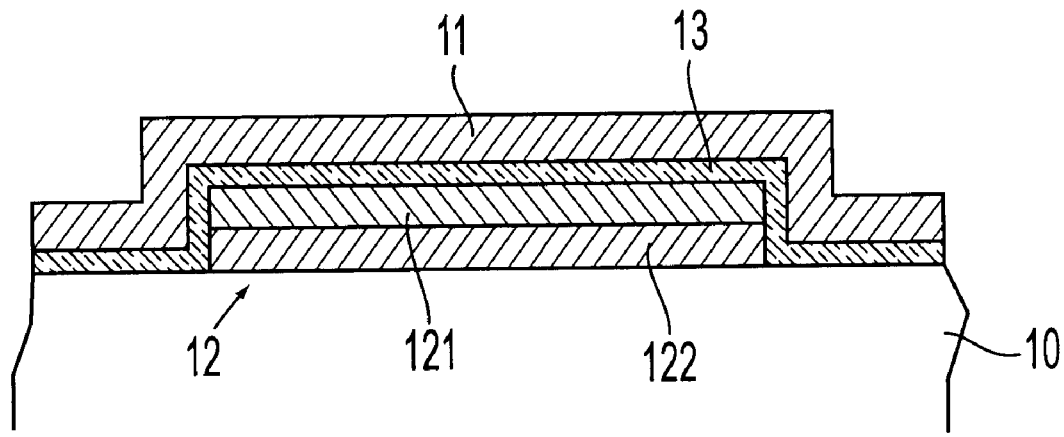

Next, as depicted in FIG. 13, the MR film 11 is deposited on the magnetic isolation film 13. The MR film 11 may be deposited by a combination of sputtering and plating.

Figure 14:
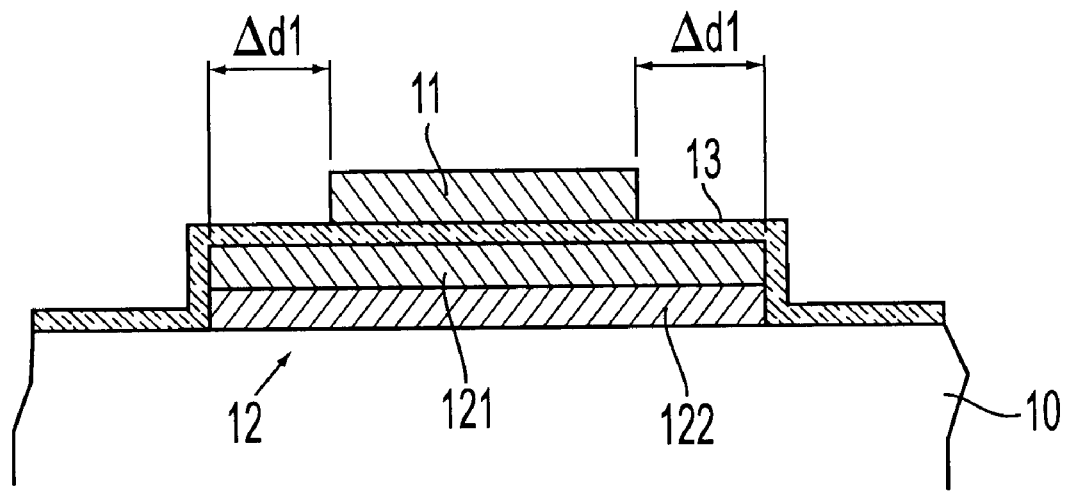

After that, as shown in FIG. 14, the MR film 11 is patterned. This patterning may be conducted by the photolithography, milling or dry or wet etching. Then, it is possible to obtain the MR film 11 having such a pattern that both ends of the MR film 11 viewed in the longitudinal direction are shifted inwardly from the both ends of the lateral film 12 viewed in the longitudinal direction by the distance Δd1. After that, the longitudinal bias films 16, 17 are formed, and then lead conductive films 14, 15 are formed to obtain the MR element having the structure shown in FIG. 9.

When the MR element shown in FIGS. 1–6 is to be manufacture, after the steps shown in FIGS. 10–13, in the patterning process illustrated in FIG. 14, the MR film 11 may be formed such that its longitudinal dimension is identical with those of the lateral bias film 12 and magnetic isolation film 13.

Figure 15:
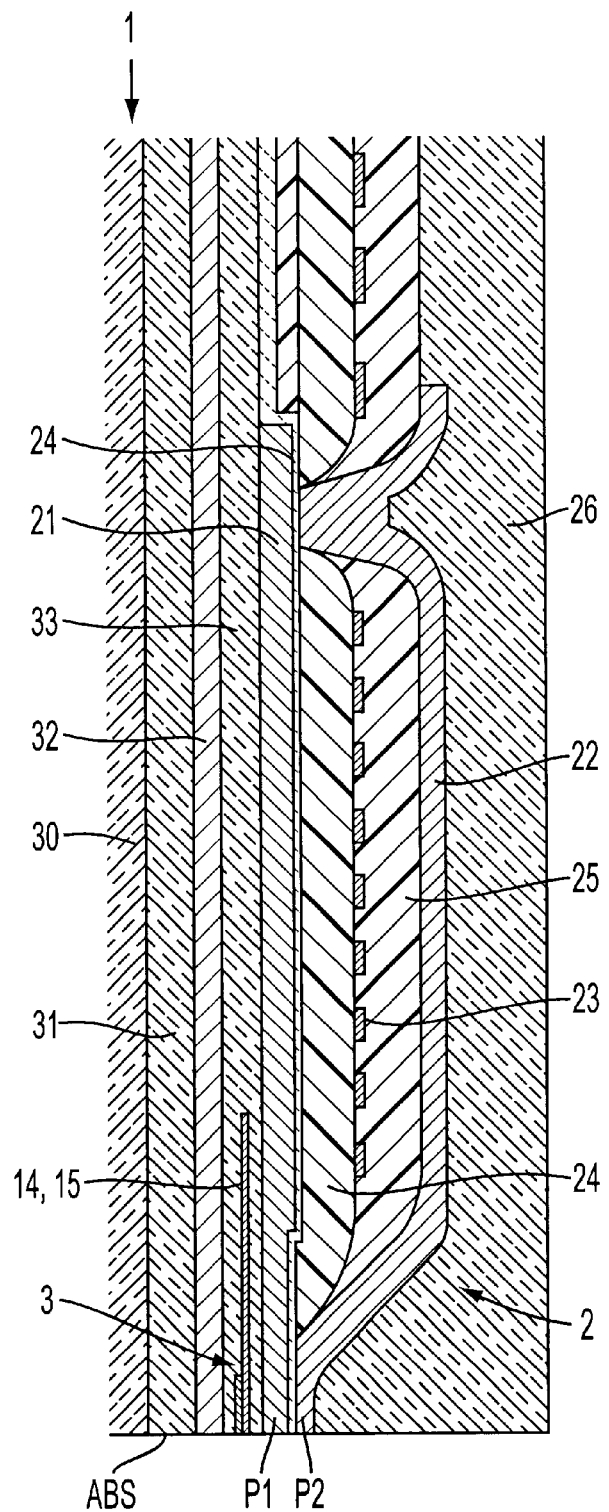
FIG. 15 is a cross sectional view showing an embodiment of the thin film magnetic head according to the invention, including the MR element as a reading element and an inductive type thin film magnetic head as a writing head.

The magnetoresistive element according to the invention can be typically used as a reading element in a thin film magnetic head. FIG. 15 is a cross sectional view of a combination type thin film magnetic head comprising a reading element formed by the magnetoresistive element and a writing element formed by an inductive type thin film magnetic head, said cross sectional view being cut perpendicularly to the air bearing surface which is to be opposed to a magnetic record medium. In the combination type thin film magnetic head shown in the drawing, a reading element 3 constructed by the magnetoresistive element according to the invention and a writing element 2 constructed by an inductive type thin film magnetic head are stacked one on the other on a slider 1.

In the slider 1, on a substrate 30 made of ceramics such as $Al_2O_3$—Ti, there are formed an insulating film 31 made of $Al_2O_3$ or $SiO_2$, a bottom shield film 32 made of a magnetic material such as Sendust, permalloy and iron nitride, and a shield gap film 33 made of $Al_2O_3$ or SiO. The slider 1 further include the air bearing surface (hereinafter referred to as ABS) which is opposed to the magnetic record medium. The slider 1 may have a rail structure and the ABS is formed on the rail structure, or the slider 1 may not have the rail structure and the ABS may be formed by a substantially whole flat surface of the slider. A reference numeral al denotes a direction in which a magnetic disc rotates.

The reading MR element 3 is embedded in the shield gap film 33. Reference numerals 14, 15 denote the lead conductive films for performing the electric supply to the MR element 3. A reference numeral 32 represents the bottom shield which is formed by a magnetic film made of Sendust, permalloy or iron nitride.

A reference numeral 21 denotes a top shield film for the MR element and is made of a soft magnetic material such as permalloy and iron nitride. The top shield 21 also serves as a bottom magnetic film of the inductive type writing thin film magnetic head element, and is also called bottom magnetic film.

The reading MR element 3 is constructed by the MR element according to the invention explained so far with reference to FIGS. 1–13. Therefore, the reading MR element 3 has the functions and merits of the MR element according to the invention.

The inductive type writing thin film magnetic head element 2 comprises the bottom magnetic film 21 serving as the top shield film, a top magnetic film 22, a thin film coil 23, a gap film 24 made of a non-magnetic material such as alumina, an insulating film 25 made of organic resin such as photoresist, and a protection film 26 made of alumina. The bottom magnetic film 21 and top magnetic film 22 constitute at their ends pole portions P1 and P2, respectively which are opposed to each other via the gap film 24 having a small thickness, and writing is performed at the pole portions P1 and P2. The bottom magnetic film 21 and top magnetic film 22 are coupled with each other at a back gap portion remote from the pole portions P1 and P2 to constitute a magnetic circuit. The thin film coil 23 is formed such that the coil windings are wound around the coupled portion of the yoke portions. The thin film coil is supported by the insulating film 25.

FIG. 15 shows only one example of the application of the magnetoresistive element according to the invention. The MR element according to the invention may be applied to various kinds of thin film magnetic heads as the reading element.

As stated above, the present invention can provide the following advantages.

(a) It is possible to provide the MR element as well as the thin film magnetic head, in which the constant lateral bias can be always applied to the MR film without being affected by the sense current and external magnetic fields.

(b) It is possible to provide the MR element as well as the thin film magnetic head, in which characteristics do not fluctuate for respective elements, and thus they can be manufactured with a high yield.

(c) It is possible to provide the MR element as well as the thin film magnetic head which can suppress noise and have the high performance.

What is claimed is:

1. A magnetoresistive element, comprising:
   a magnetoresistive film through which a sense current for detecting a change in resistance due to a magnetization to be detected flows in a longitudinal direction;
   a pair of lead conductive films coupled with both ends of the magnetoresistive film viewed in the longitudinal direction in an electrically conductive manner and conducting the sense current in the longitudinal direction;
   a lateral bias film magnetized in a fixed direction by a constant magnitude to apply a lateral bias in a lateral direction which crosses with said longitudinal direction, said lateral bias being not influenced by said sense current and external magnetic field;
   a magnetic isolation film arranged between the magnetoresistive film and the lateral bias film and being made of an electrically insulating non-magnetic material; and
   a substrate supporting said magnetoresistive film, lead conductive films, lateral bias film and magnetic isolation film.

2. A magnetoresistive element according to claim 1, wherein said longitudinal direction and said lateral direction are perpendicularly crossed with each other.

3. A magnetoresistive element according to claim 1, wherein said lateral bias film comprises an antiferromagnetic film and a magnetic film which is exchange-coupled with said antiferromagnetic film.

4. A magnetoresistive element according to claim 3, wherein said antiferromagnetic film is made of a material selected from the group consisting of PtMn, NiMn, NiO, CoO, $\alpha$-$Fe_2O_3$ and compounds containing $\alpha$-$Fe_2O_3$.

5. A magnetoresistive element according to claim 3, wherein said magnetic film is made of a material selected from the group consisting of Co, compounds containing Co and at least one metal; NiFe, alloys containing NiFe and at least one metal; Fe, alloys containing Fe and at least one metal; and compounds containing Fe, at least one metal and at least one of N, C and B.

6. A magnetoresistive element according to claim 1, wherein said lateral bias film includes a hard magnetic film.

7. A magnetoresistive element according to claim 6, wherein said hard magnetic film is made of a material selected from the group consisting of Co, Ni, Fe and alloys containing at least one of these metals.

8. A magnetoresistive element according to claim 1, wherein said lateral bias film is arranged closer to said substrate than said magnetoresistive film.

9. A magnetoresistive element according to claim 1, wherein said lateral bias film is arranged more remote from said substrate than said magnetoresistive film.

10. A magnetoresistive element according to claim 1, wherein said lateral bias film and magnetoresistive film have plane configurations such that corresponding edges of said lateral bias film and magnetoresistive film are aligned with each other.

11. A magnetoresistive element according to claim 1, wherein said lateral bias film and magnetoresistive film have plane configurations such that both edges of said lateral bias film are protruded outwardly from corresponding edges of said magnetoresistive film.

12. A combination type thin film magnetic head comprising a reading thin film head constructed by the magnetoresistive element as claimed in claim 1 and an inductive type writing thin film magnetic head, said thin film heads being stacked one on the other on a substrate.

13. A magnetoresistive element, comprising:
   a magnetoresistive film through which a sense current for detecting a change in resistance due to a magnetization to be detected flows in a longitudinal direction;
   a pair of lead conductive films coupled with both ends of the magnetoresistive film viewed in the longitudinal direction in an electrically conductive manner and conducting the sense current in the longitudinal direction;
   a lateral bias film magnetized in a fixed direction by a constant magnitude to apply a lateral bias in a lateral direction which crosses with said longitudinal direction, said lateral bias being not influenced by said sense current and external magnetic field;
   a magnetic isolation film arranged between the magnetoresistive film and the lateral bias film and being made of an electrically insulating non-magnetic material;
   a pair of longitudinal bias films provided at respective end portions of said magnetoresistive film for applying a longitudinal bias to the magnetoresistive film in a longitudinal direction crossing with the lateral direction; and
   a substrate supporting said magnetoresistive film, lead conductive films, lateral and longitudinal bias films and magnetic isolation film such that said lateral bias film is isolated from said lead conductive films and longitudinal film magnetically and electrically.

14. A magnetoresistive element according to claim 13, wherein said magnetic isolation film is made of an electrically insulating non-magnetic material selected from the group consisting of $Al_2O_3$, AlN, $SiO_2$, SiN, BN and AlON.

15. A magnetoresistive element, comprising:
   a substrate made of an electrically insulating material and having a surface;
   a lateral bias film provided on said surface of the substrate;
   a magnetic isolation film made of an electrically insulating non-magnetic material and arranged to completely cover said lateral bias film such that the magnetic isolation film extends over the surface of the substrate;
   a magnetoresistive film provided on the magnetic isolation film, through said magnetoresistive film a sense current flowing in a longitudinal direction for detecting a change in resistance due to a magnetization to be detected; and a pair of lead conductive films provided on said magnetic isolation film such that the lead conductive films are coupled with both ends of the magnetoresistive film viewed in the longitudinal direction in an electrically conductive manner and conducting the sense current in the longitudinal direction;

wherein said lateral bias film is magnetized in a fixed direction by a constant magnitude to apply a lateral bias to the magnetoresistive film in the lateral direction which crosses with said longitudinal direction, said lateral bias being not influenced by said sense current and external magnetic field.

16. A magnetoresistive element according to claim 15, wherein said magnetoresistive film is provided on said magnetic isolation film such that longitudinal edges of the magnetoresistive film viewed in the longitudinal direction are retarded inwardly with respect to corresponding longitudinal edges of the lateral bias film by a given distance, and said lead conductive films are provided to extend on the magnetic isolation film inwardly over the lateral edges of the lateral bias film.

17. A magnetoresistive element according to claim 15, further comprising a pair of longitudinal bias films provided between said magnetic isolation film and said lead conductive films at respective end portions of said magnetoresistive film for applying a longitudinal bias to the magnetoresistive film in the longitudinal direction.

18. A magnetoresistive element according to claim 17, wherein said magnetoresistive film is provided on said magnetic isolation film such that longitudinal edges of the magnetoresistive film viewed in the longitudinal direction are retarded inwardly with respect to corresponding longitudinal edges of the lateral bias film by a given distance, and longitudinal bias films and lead conductive films are provided to extend on the magnetic isolation film inwardly over the lateral edges of the lateral bias film.

19. A magnetoresistive element, comprising:

a magnetoresistive film through which a sense current for detecting a change in resistance due to a magnetization to be detected flows in a longitudinal direction;

a pair of lead conductive films coupled with both ends of the magnetoresistive film viewed in the longitudinal direction in an electrically conductive manner and conducting the sense current in the longitudinal direction;

a lateral bias film magnetized in a fixed direction by a constant magnitude to apply a lateral bias in a lateral direction which crosses with said longitudinal direction, said lateral bias being not influenced by said sense current and external magnetic field;

a magnetic isolation film arranged between the magnetoresistive film and the lateral bias film; and a substrate supporting said magnetoresistive film, lead conductive films, lateral bias films and magnetic isolation film such that longitudinal edges of the magnetoresistive film viewed in the longitudinal direction are retarded inwardly with respect to corresponding longitudinal edges of the lateral bias film by a given distance $\Delta d1$ which is determined by a track width defined by a longitudinal length $\Delta d2$ of the magnetoresistive film between the lead conductive films.

20. A magnetoresistive element according to claim 19, wherein said distance $\Delta d1$ is not less than 0.2 $\mu$m when $\Delta d2$ is not less than 1.0 $\mu$m, and said distance $\Delta d1$ is not less than 0.10 $\mu$m when $\Delta d2$ is smaller than 1.0 $\mu$m.

21. A magnetoresistive element according to claim 19, wherein said magnetic isolation film is made of an electrically insulating non-magnetic material, and said lateral bias film is isolated from the lead conductive films magnetically and electrically.

22. A magnetoresistive element according to claim 21, wherein said magnetic isolation film is made of an electrically insulating non-magnetic material selected from the group consisting of $Al_2O_3$, AlN, $SiO_2$, SiN, BN and AlON.

23. A magnetoresistive element according to claim 19, further comprising a pair of longitudinal bias films provided between said magnetic isolation film and said lead conductive films at respective end portions of said magnetoresistive film for applying a longitudinal bias to the magnetoresistive film in the longitudinal direction.

* * * * *